(12) United States Patent
Linares et al.

(10) Patent No.: US 11,996,679 B2
(45) Date of Patent: May 28, 2024

(54) SUPPORT BOX, ELECTRICAL CONNECTION ENCLOSURE COMPRISING SUCH A SUPPORT BOX AND METHOD FOR ASSEMBLING SUCH AN ELECTRICAL ENCLOSURE

(71) Applicant: Schneider Electric Industries SAS, Rueil-Malmaison (FR)

(72) Inventors: Louis Linares, La Terrasse (FR); Jean-Claude Moresco, Echirolles (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 27 days.

(21) Appl. No.: 17/701,754

(22) Filed: Mar. 23, 2022

(65) Prior Publication Data
US 2022/0311222 A1  Sep. 29, 2022

(30) Foreign Application Priority Data
Mar. 26, 2021 (FR) .................................. FR 2103095

(51) Int. Cl.
*H05K 7/14* (2006.01)
*H02B 1/34* (2006.01)

(52) U.S. Cl.
CPC ............. *H02B 1/34* (2013.01); *H05K 7/1432* (2013.01); *H05K 7/1489* (2013.01)

(58) Field of Classification Search
CPC . H02B 1/34; H02B 1/012; H02B 1/36; H02B 1/30; H02B 1/052; H02B 1/32; H02B 3/00; H05K 7/1432; H05K 7/1489
See application file for complete search history.

(56) References Cited

U.S. PATENT DOCUMENTS 6,398,041 B1  6/2002 Abbott
6,600,656 B1*  7/2003 Mori ..................... H05K 7/1421
                                              361/826
2005/0285492 A1* 12/2005 Hu .......................... A47B 88/43
                                              312/334.4

FOREIGN PATENT DOCUMENTS

DE       1515561 A1   7/1969
EP       2277248 B1   5/2013
(Continued)

OTHER PUBLICATIONS

French Search Report dated Nov. 24, 2021 for corresponding French Patent Application No. FR 2103095, 2 pages.

*Primary Examiner* — Anthony Q Edwards
*Assistant Examiner* — Hung Q Dang
(74) *Attorney, Agent, or Firm* — Locke Lord LLP

(57) ABSTRACT

A support box (60) for supporting functional elements within the frame (28) of an electrical connection enclosure comprises at least one pair (70) of rails (72) for guiding a monitoring/control plug-in unit forming a functional element in translation, a parallelepipedal framework (62) and members for fastening the framework to the frame. The framework comprises two horizontal plates, a vertical back that is perpendicular to the horizontal plates, and two vertical walls, each supporting a rail of each pair of rails. The members for fastening the framework to the frame comprise fastening lugs that are elastically deformable and integral with the horizontal plates and elastically deformable load absorbing lugs that are integral with the vertical walls. The support box comprises at least one centring pin, vertically centring the box with respect to a post (32) of the frame, each centring pin being arranged in a positioning hole of a fastening lug.

7 Claims, 12 Drawing Sheets

(56) References Cited

FOREIGN PATENT DOCUMENTS

| | | |
|---|---|---|
| RU | 2741065 C1 | 1/2021 |
| WO | 2003101161 A2 | 12/2003 |
| WO | 2019192689 A1 | 10/2019 |

* cited by examiner

SUPPORT BOX, ELECTRICAL CONNECTION ENCLOSURE COMPRISING SUCH A SUPPORT BOX AND METHOD FOR ASSEMBLING SUCH AN ELECTRICAL ENCLOSURE

TECHNICAL FIELD

The present invention relates to a support box for an electrical connection enclosure, an electrical connection enclosure comprising such a support box and a method for assembling such an electrical enclosure.

BACKGROUND

In the field of industrial electrical enclosures, it is known practice to install one or more monitoring-control plug-in units in an electrical connection enclosure. These monitoring-control plug-in units comprise electronic elements, and notably circuit breakers, which allow the electrical enclosure to be connected to electrical loads and to supply electrical power to these electrical loads.

For that, a monitoring-control plug-in unit is connected, on the one hand, to a source of electricity, such as, for example, a bus, via upstream connectors, and, on the other hand, to an electrical load, via downstream connectors.

It is also known that such monitoring-control plug-in units can be movable in an electrical connection enclosure between an operating position in which the upstream and downstream connectors are connected respectively to the source of electricity and to the electrical load, and an unplugged position in which the upstream and downstream connectors are not connected.

Generally, this mobility is ensured by making a plug-in unit roll on a support plate fastened directly to a frame of the electrical enclosure.

Such a solution presents the drawback of being imprecise, because the frame of an electrical enclosure risks being deformed, which means that the positioning of a support plate is not very precise, because it is dependent on the deformations of the framework. Thus, the positioning of a monitoring-control plug-in unit inside an electrical enclosure cannot be done accurately. That is prejudicial to the correct operation of the upstream and downstream connectors.

To compensate for this imprecision in the positioning of a monitoring-control plug-in unit, it is known practice to connect such a plug-in unit to the source of electricity and to the electrical load using flexible connectors. However, such flexible connectors present the drawback of being bulky and of preventing optimization of the space used by the monitoring-control plug-in unit and by the connectors.

To compensate for this imprecision in the positioning of a monitoring-control plug-in unit, it is also known practice to connect such a plug-in unit to the source of electricity and to the electrical load using rigid connectors configured to accept significant variations in the positioning of the plug-in unit. However, such connectors are costly and are also bulky.

Document WO-A-2019/192689 describes an electrical enclosure comprising compartments each adapted to receive a plug-in module. These compartments are formed by a base, a roof, at least one side wall and a back, and are assembled to a framework of the electrical enclosure by screwing. These compartments are not suitable for installation in an enclosure with a deformed frame, as they do not compensate for frame defects. When these compartments are installed in an enclosure with a deformed frame, the modules may become complex or impossible to insert and remove from the compartments.

SUMMARY

It is these drawbacks that the invention sets out more particularly to remedy by proposing an enhanced device for fastening at least one monitoring-control plug-in unit in an electrical connection enclosure.

The present invention relates to a box for supporting functional elements within the frame of an electrical connection enclosure, this box comprising:
 at least one pair of rails for guiding a monitoring-control plug-in unit forming a functional element in translation;
 a parallelepipedal framework comprising:
  two horizontal plates in a mounted configuration of the box in the frame;
  a back that is perpendicular to the horizontal plates and vertical in the mounted configuration of the box in the frame; and
  two walls that are vertical in the mounted configuration of the box in the frame and that each support a rail of each pair of rails,
 members for fastening the framework to the frame.

According to the invention, the members for fastening the framework to the frame of the electrical enclosure comprise fastening lugs that are elastically deformable and integral with the horizontal plates, the members for fastening the framework to the frame of the electrical enclosure comprise elastically deformable load absorbing lugs, integral with the vertical walls, and the support box further comprises at least one centring pin, configured to vertically centre the box with respect to a post of the frame of the enclosure, each centring pin being arranged in a positioning hole of a fastening lug.

By virtue of the invention, the support box comprises means for guiding at least one monitoring-control plug-in unit, the positioning of which is not constrained by the positioning of the frame of the electrical connection enclosure because the box ensures an effective positioning of the functional elements, independently of any deformation of the frame of the electrical enclosure. In addition, the members for fastening the framework to the frame and the centring pin effectively compensate for any deformation of the enclosure frame.

According to aspects of the invention that are advantageous but not mandatory, the support box incorporates one or more of the following features, taken alone or according to all technically acceptable combinations:

Each plate of the framework comprises a main web, horizontal in the mounted configuration of the box in the frame of the electrical enclosure, and a border, perpendicular to the main web and parallel to the back of the framework, and the back of the framework is fastened to the borders of the plates.

Each horizontal plate of the framework comprises tabs forming two positioning guides, each positioning guide being configured to position a vertical wall of the framework with respect to the horizontal plate comprising this positioning guide.

The back of the framework comprises at least two notches, each notch being configured to position a vertical wall of the framework with respect to the back.

According to another aspect, the invention relates also to an electrical connection enclosure comprising at least:
 a frame, the frame being of overall parallelepipedal form and comprising vertical posts;

at least one support box as described above; and at least one functional element comprising at least one monitoring-control plug-in unit, each functional element being mounted in a box and each monitoring-control plug-in unit being movable in translation in a pair of guiding rails of a box.

This electrical connection enclosure brings about the same advantages as those mentioned above concerning the support box of the invention.

Advantageously, the functional elements mounted in a support box comprise at least:

at least one monitoring-control plug-in unit, a protection unit, the protection unit being common to all the monitoring-control plug-in units mounted in the box, supplying electrical energy to all the monitoring-control plug-in units and electrically protecting all the monitoring-control plug-in units, the protection unit being fastened to a vertical wall of the framework of the box and supporting the rail of each pair of rails associated with this vertical wall, a computer bus section configured to connect all the monitoring-control plug-in units of the box to an industrial computer, and several connection modules, notably as many connection modules as there are monitoring-control plug-in units, each connection module being configured to electrically connect a monitoring-control plug-in unit to an electrical load.

According to another aspect, the invention relates also to a method for assembling an electrical connection enclosure which comprises at least phases consisting in:

assembling a support box as described above on the frame of a column, between vertical posts; and equipping the box, in place in the column, with functional elements.

This assembly method brings about the same advantages as those mentioned above concerning the support box of the invention.

BRIEF DESCRIPTION OF THE DRAWINGS

The invention will be better understood and other advantages thereof will become more clearly apparent in light of the following description of an embodiment of a support box, of an electrical connection enclosure and of an assembly method that conform to the principle thereof, given purely by way of example and with reference to the attached drawings in which.

DETAILED DESCRIPTION

Figure 1:
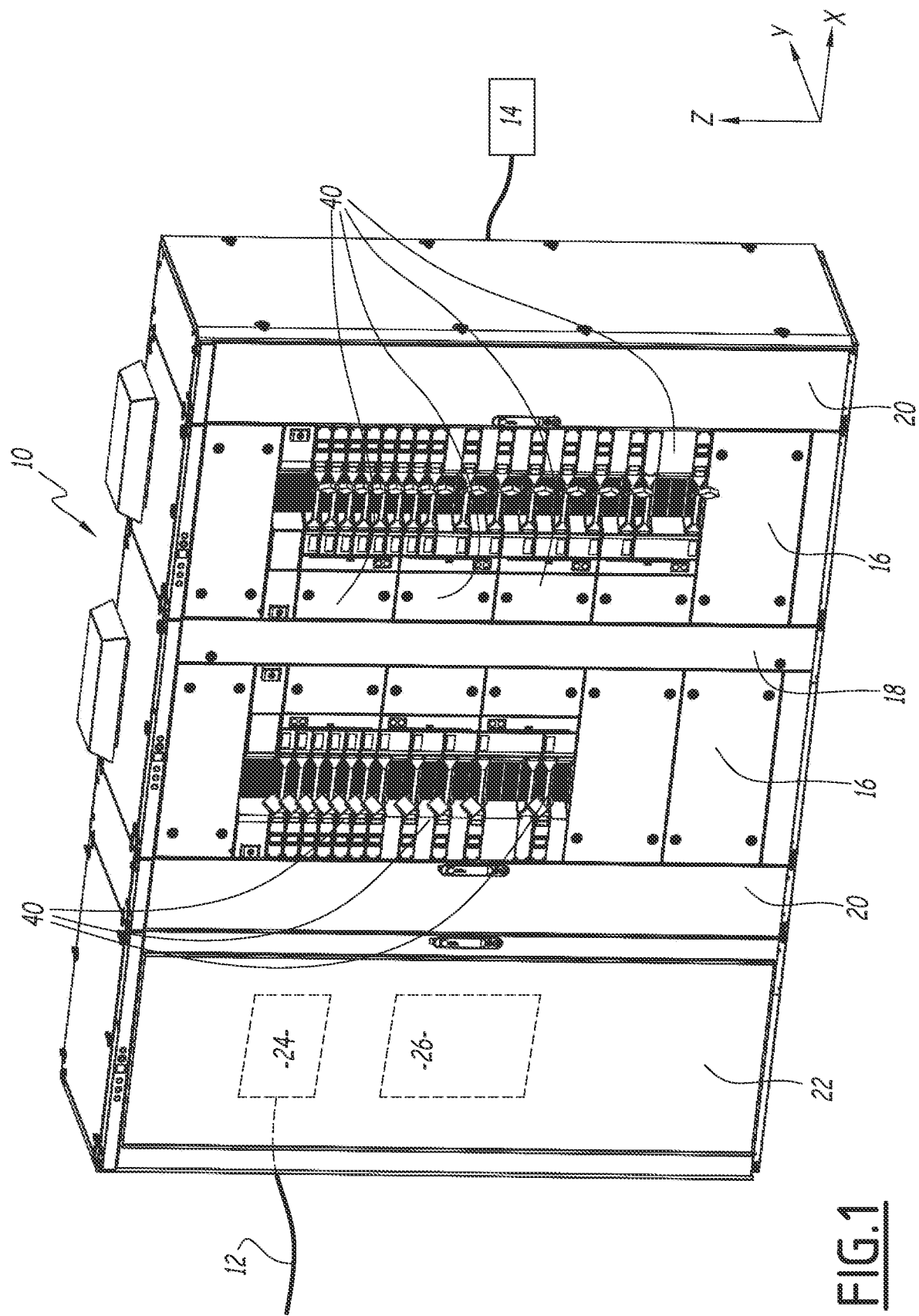
FIG. 1 is a perspective view of an electrical enclosure that conforms to the invention.
Figure 2:
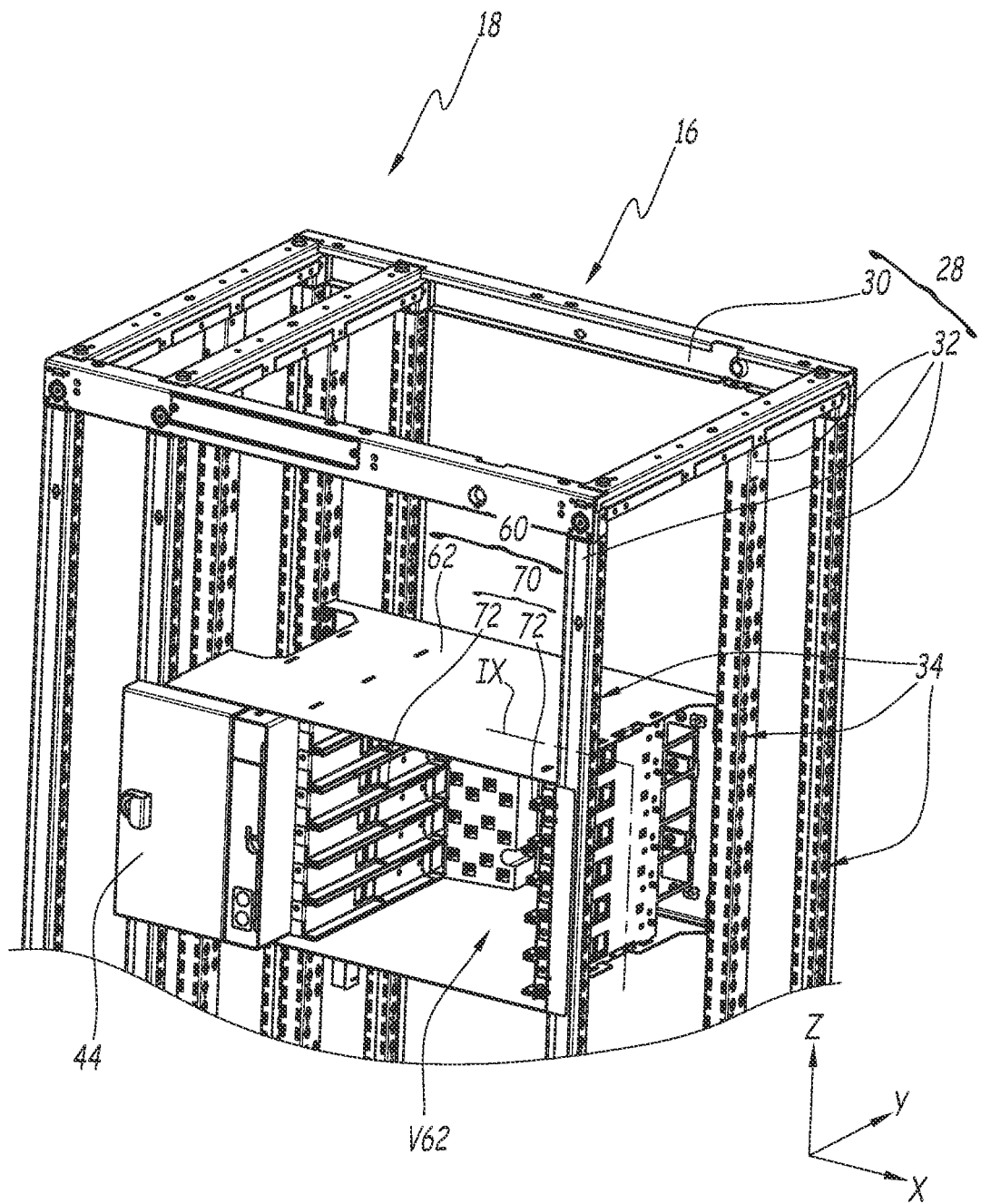
FIG. 2 is a perspective view of a part of the frame of the electrical enclosure of FIG. 1 and of a support box that conforms to the invention.

An electrical enclosure 10 is represented in FIGS. 1 and 2. This electrical enclosure is intended to be incorporated in an electrical network that is partially represented. This electrical network comprises, on the one hand, upstream of the electrical enclosure 10, power supply cables 12 originating for example from a transformer sub-station and, on the other hand, downstream of the electrical enclosure, one or more electrical loads 14.

The electrical enclosure 10 is a connection enclosure configured to connect the electrical loads 14 to the power supply cables 12.

The power supply cable 12 delivers to the electrical enclosure 10 a main electrical power supply, preferably of a three-phase 400 V voltage with neutral, preferably with a 50 Hz frequency. As a variant, the power supply cable 12 delivers a three-phase current without neutral, or a single-phase current. As a variant, the power supply is delivered at a frequency of 60 Hz and at a different voltage, for example 1000 V.

The electrical loads 14 can for example be electric motors, such as three-phase motors, electricity distribution networks, or even controllable electrical loads, such as batteries or photovoltaic panels.

A longitudinal axis X of the electrical enclosure 10 is defined as being the axis of the greatest dimension of the electrical enclosure 10, in practice its length, a transverse axis Y is defined as being the axis of the smallest dimension of the electrical enclosure 10 and perpendicular to the axis X, in practice its width, and a vertical axis Z is defined as being the third axis of an orthogonal reference frame comprising the axes X and Y.

The orientation of the axes X, Y and Z is fixedly linked to the orientation of the electrical enclosure 10. The orientation of the electrical enclosure 10 described in the present explanation corresponds to its mounted configuration. It is therefore understood that the orientation of the axes X, Y and Z varies when the orientation of the electrical enclosure 10 varies. For example, the axis Z may not be vertical when the enclosure 10 is not in the mounted configuration, for example when it is transported. The qualifiers "top", "bottom" and "vertical" used hereinafter in the explanation are understood relative to the axis Z.

In the mounted configuration described here, the plane formed by the axes X and Y is horizontal. The qualifier "horizontal" used hereinafter in the explanation applies to any element contained in a plane parallel to the plane formed by the axes X and Y, in the mounted configuration of the electrical enclosure 10. The qualifiers "left" and "right" are understood relative to the axis X and the qualifiers "front", "back" and "rear" are understood relative to the axis Y, and relative to the orientations represented in the figures.

The relative positioning of the parts and their orientation described hereinbelow are given purely by way of example and are not limiting. Unless explicitly stipulated otherwise, they are understood to be in the mounted and installed configuration of the electrical enclosure 10. Thus, when the orientation of a part with respect to the axes X, Y and/or Z is mentioned, it is understood to be in the mounted configuration of the enclosure. When the enclosure 10 is stored, transported, not-assembled or being assembled, among other examples, the orientation of the parts and their relative positioning may vary.

As can be seen in FIG. 1, the electrical enclosure 10 comprises several columns 16, juxtaposed according to the axis X.

In practice, the electrical enclosure 10 comprises at least one connection column 16. In the example, the electrical enclosure 10 comprises two connection columns 16. Each connection column 16 allows one or more electrical loads 14 to be electrically connected to the electrical enclosure 10 and makes it possible to monitor the electrical loads 14 which are connected to it.

Furthermore, each connection column 16 comprises functional elements 17, as detailed hereinbelow.

Advantageously, the electrical enclosure 10 also comprises at least one electrical distribution column 18. Each electrical distribution column 18 connects one or two connection columns 16 to the power supply cable 12.

Preferably, each electrical distribution column 18 comprises a power supply bus, not represented, to make this connection.

Advantageously, the electrical enclosure 10 also comprises at least one cabling column 20. Each cabling column 20 comprises electrical cables, not represented, which link a connection column 16 to one or more electrical loads 14. Thus, a cabling column 20 is associated with each connection column 16.

Advantageously, the electrical enclosure 10 also comprises a main column 22, which comprises, for example, a circuit breaker 24 that makes it possible to cut the power supply from the power supply cable 12 and an industrial computer 26 or a connection module for connecting to an industrial computer.

As can be seen in FIG. 2, the electrical enclosure 10 comprises a frame 28. The frame 28 forms a structure of the electrical enclosure 10 and supports the functional elements 17.

In FIG. 2, only a part of the frame, corresponding to a connection column and to an electrical distribution column, is represented.

The frame 28 in practice comprises horizontal crossmembers 30, arranged at the top and bottom ends of the electrical enclosure 10 and parallel to the plane formed by the axes X and Y, and vertical posts 32, which extend according to axes parallel to the axis Z and which link the horizontal crossmembers 30. The frame 28 is of parallelepipedal form.

Fastening holes 34 are formed on the vertical posts 32.

The functional elements 17 of the connection columns 16 of the electrical enclosure 10 are, in practice, elements that make it possible to ensure the correct operation of the enclosure.

Advantageously, the functional elements 17 are grouped together in functional modules 40, seven of which are represented in FIG. 1, distributed over two connection columns 16.

Preferably, each functional module 40 comprises all or some of the following functional elements 17:
  one or more monitoring-control plug-in units 42;
  a protection unit 44;
  one or more connection units 46;
  a computer bus section 48; and
  one or more input-output units 50.

Figure 3:
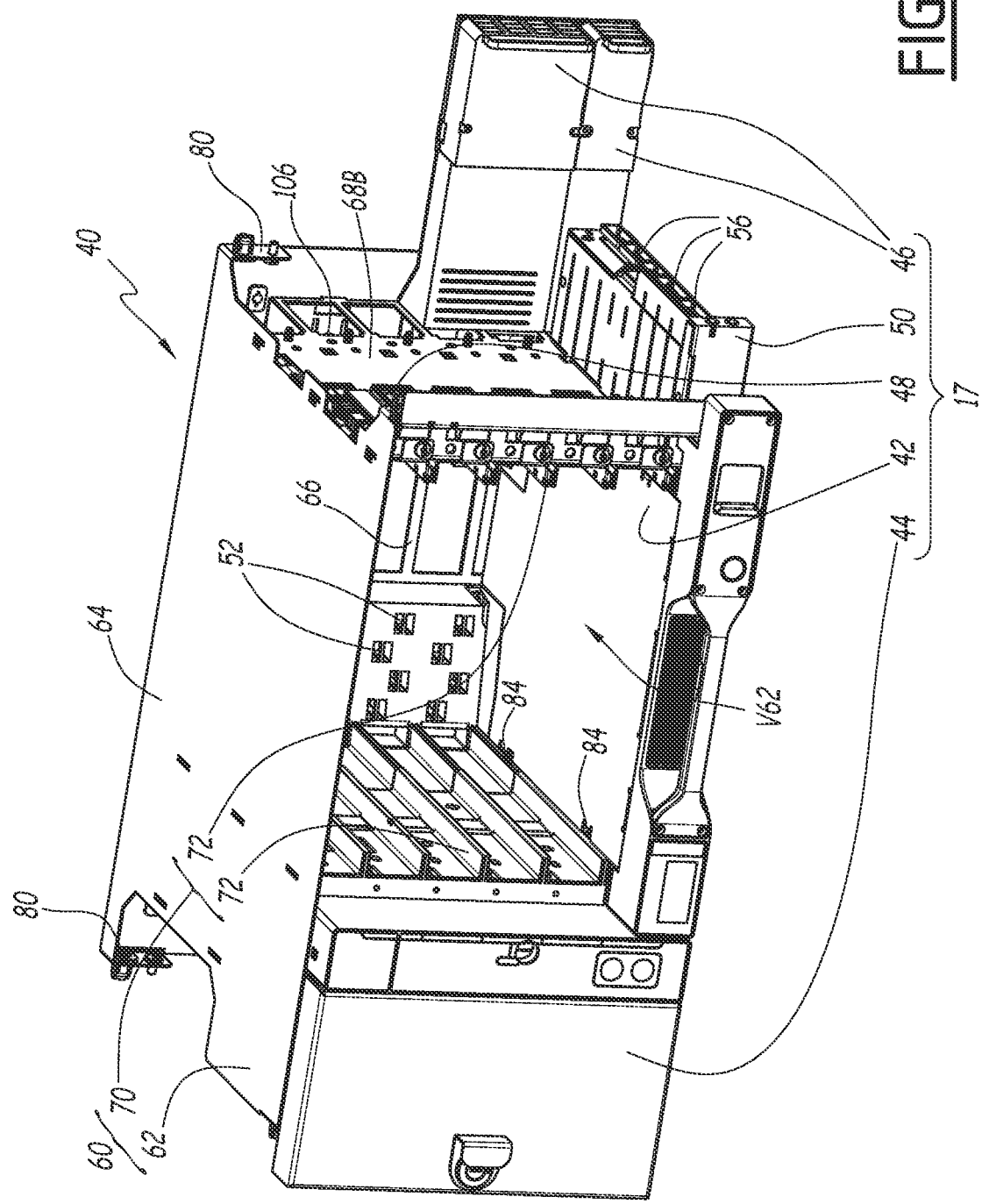
FIG. 3 is a perspective view of the support box of FIG. 2.

A functional module 40 comprising a monitoring-control plug-in unit 42, a protection unit 44, two connection units 46, a computer bus section 48 and an input-output unit 50 is represented in FIG. 3.

Figure 4:
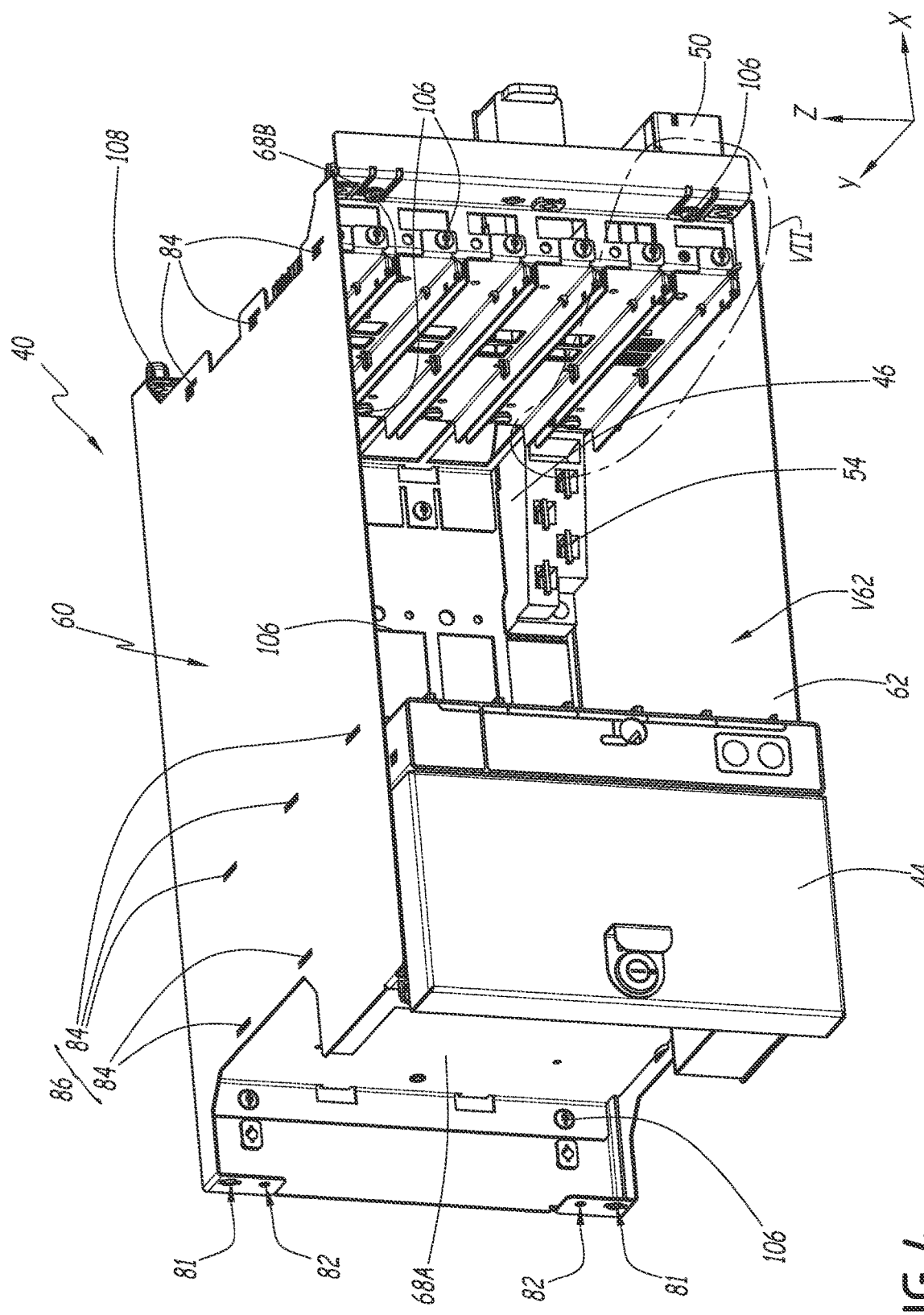
FIG. 4 is a perspective view of the support box of FIGS. 2 and 3 seen from another angle.

In FIG. 4, the protection unit 44, a connection unit 46 and an input-output unit are represented.

Figure 5:
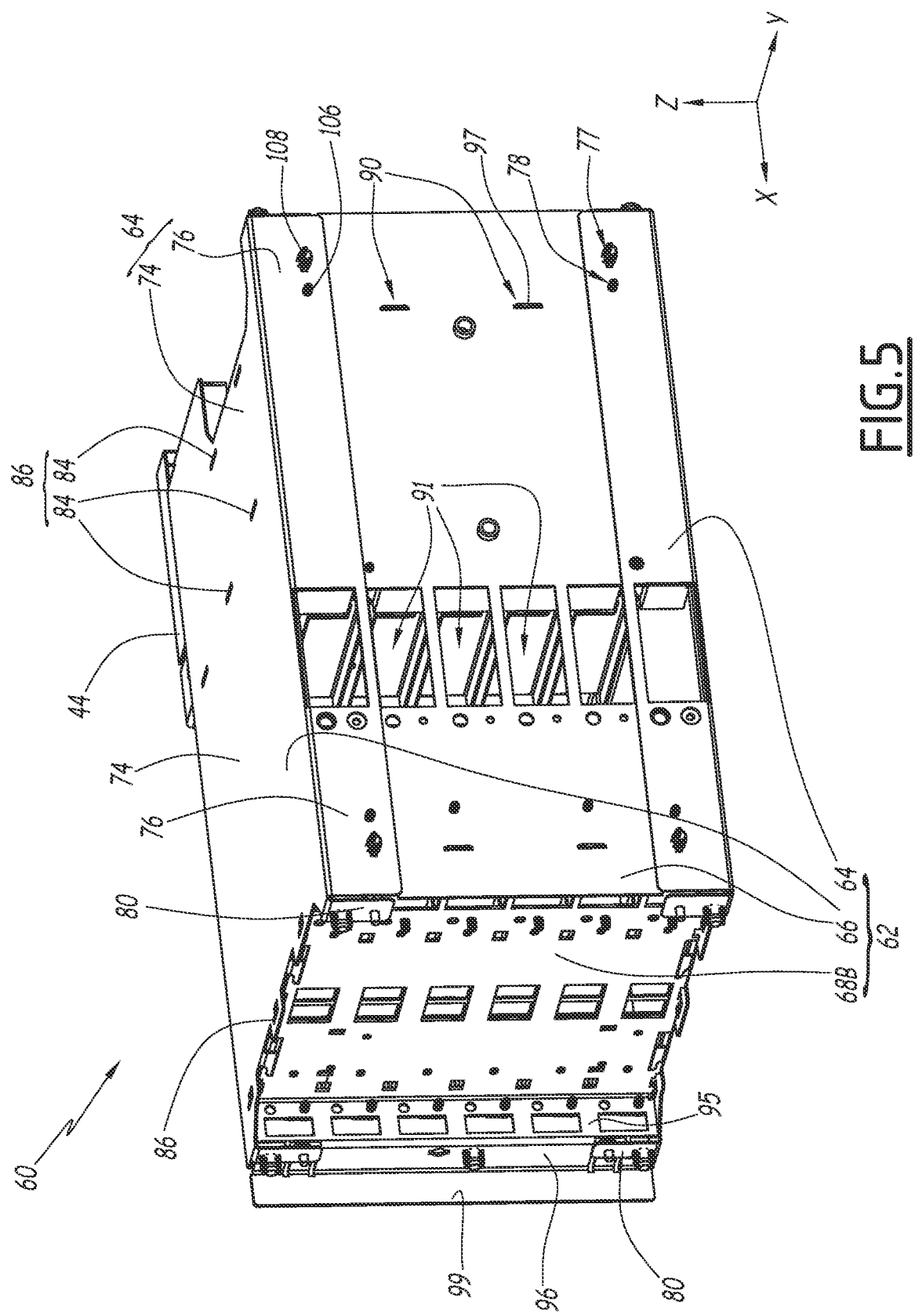
FIG. 5 is a perspective view of the support box of FIGS. 2 to 4 seen from another angle.
Figure 6:
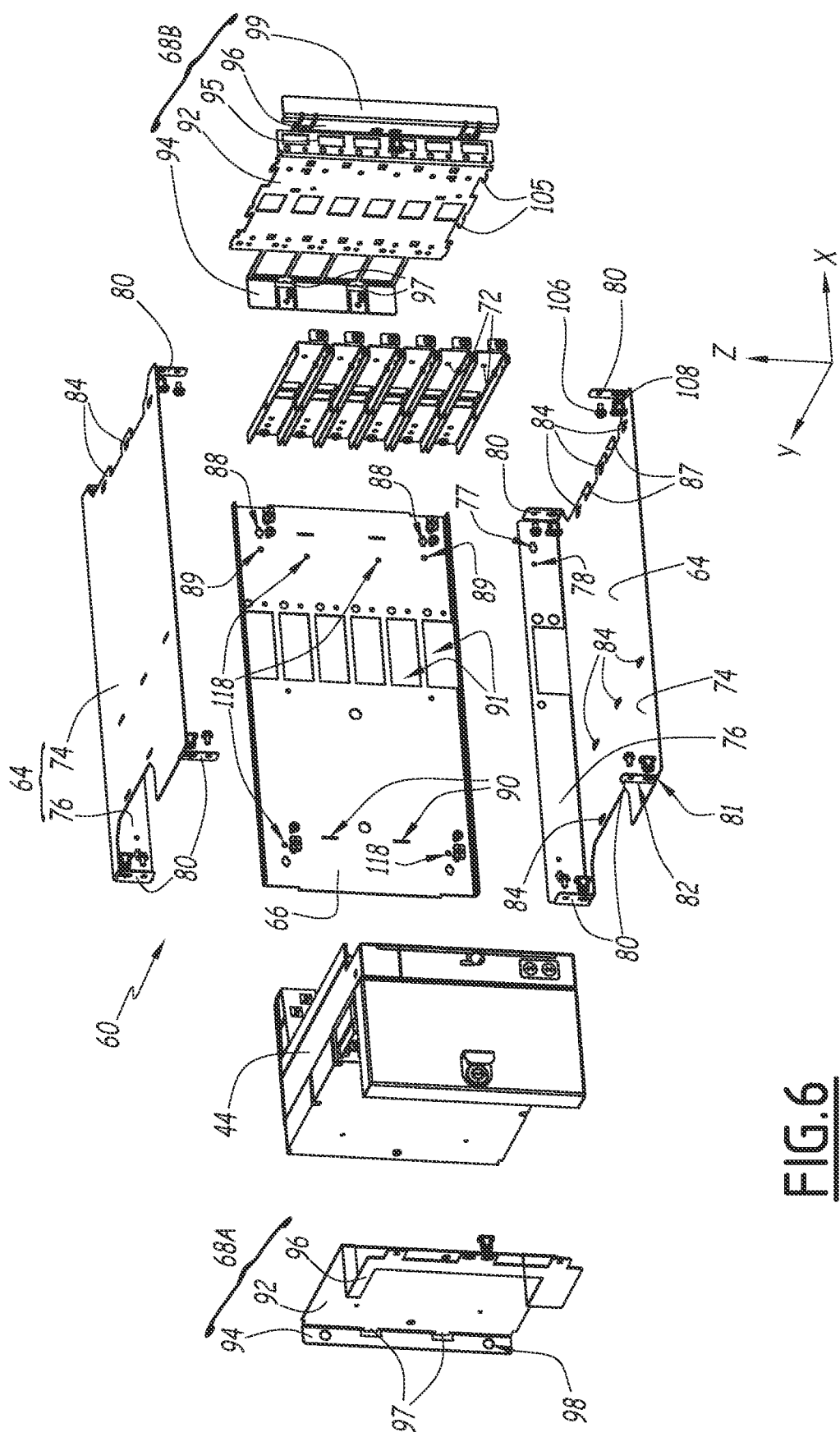
FIG. 6 is an exploded perspective view of the support box of FIGS. 2 to 5.

In FIGS. 2, 5 and 6, only the protection unit 44 is represented.

Each monitoring-control plug-in unit 42 allows an electrical load 14 to be electrically connected and possibly controlled and/or monitored. Thus, the electrical current originating from the power supply cable 12 is redirected to the electrical loads 14 through the monitoring-control plug-in units 42.

In practice, a functional module 40 comprises one or more plug-in units, preferably between one and six plug-in units.

Furthermore, depending on the nature of the electrical load 14 monitored by a monitoring-control plug-in unit 42 and depending on the control and/or monitoring functions performed by this plug-in unit, the height of the plug-in unit, measured parallel to the axis Z, can vary, as can be seen in FIG. 1.

Furthermore, each monitoring-control plug-in unit 42 is movable in translation in a connection column 16, between a plugged-in position in which the plug-in unit is connected on the one hand to the power supply cable 12 and on the other hand to the electrical load 14 that it powers, and an unplugged position, in which the plug-in unit is connected neither to the power supply cable nor to the electrical load.

The plug-in unit 42 is represented in the plugged-in position in FIG. 3.

Each protection unit 44 is configured to electrically protect one or more monitoring-control plug-in units 42 and the electrical loads 14 which are connected to these plug-in units, notably in case of failure of an electrical load 14, like a short-circuit for example.

The protection units 44 are, for example, circuit breakers arranged upstream of the monitoring-control plug-in units 42 and which make it possible to break the electrical current supplying the electrical loads 14 via the monitoring-control units 42 in the event of an incident. In other words, the protection units 44 monitor the electrical power supply of the monitoring-control plug-in units 42 and are arranged between the plug-in units 42 and an electrical distribution column 18.

Advantageously, the protection unit 44 of a functional module 40 protects all the monitoring-control plug-in units 42 of this functional module. In other words, the protection unit 44 of a functional module 40 is common to all the monitoring-control plug-in units 42 of that functional module.

Furthermore, each protection unit 44 comprises upstream fixed connectors 52. When a monitoring-control plug-in unit 42 is in the plugged-in position, this plug-in unit is plugged in on the upstream fixed connectors 52, so as to be electrically linked to the protection unit 44. When a plug-in unit is in the unplugged position, it is away from the upstream fixed connectors 52.

Each connection unit 46 is associated with a monitoring-control plug-in unit 42. Thus, a functional module 40 comprises as many connection units 46 as there are plug-in units 42.

Each connection unit 46 is configured for an electrical load 14 to be connected to it and to supply this electrical load with electrical energy, from a monitoring-control plug-in unit 42. Thus, a connection unit 46 is arranged as intermediary, and connected, between a plug-in unit 42 and an electrical load 14.

In practice, as can be seen in FIGS. 3 and 4, a connection unit 46 extends partly out of the function module 40, towards the adjacent cabling column 20.

Thus, the cabling necessary for the connection of an electrical load 14 to a connection unit 46 is done in the cabling column 20, rather than in the connection column 16, which is advantageous. In fact, since the available space is greater in the cabling column 20, this connection is thus facilitated. In practice, a large number of connection cables can be arranged in a cabling column 20, for example up to a hundred cables.

Furthermore, each connection unit 46 comprises downstream fixed connectors 54. When a monitoring-control plug-in unit 42 is in the plugged-in position, the plug-in unit is plugged in on the downstream fixed connectors 54 so as to be electrically linked to the connection unit 46. When a plug-in unit is in the unplugged position, it is away from the downstream fixed connectors 54.

The fact that the monitoring-control plug-in unit 42 is plugged into upstream 52 and downstream 54 fixed connectors is advantageous, because that makes it possible to easily connect or disconnect the plug-in unit, simply by displacing the plug-in unit in the functional module 40.

Thus, there is no need to perform specific connection operations to tilt a monitoring-control plug-in unit 42 to the plugged-in position.

The computer bus section 48 of a functional module 40 connects each monitoring-control plug-in unit 42 to the industrial computer 26, so as to allow the exchange of data, such as operating setpoints or measurements performed by sensors, between the plug-in units and the industrial computer.

In the example represented, the computer bus section 48 is an electronic circuit board which extends vertically and which bears electronic circuits and electrical power supply tracks, not represented.

Each input-output unit 50 makes it possible to connect, on the one hand, a monitoring-control plug-in unit 42 of a functional module 40 to the computer bus section 48 of this functional module, and, on the other hand, by virtue of input-output connectors 56, the electrical enclosure 10 to sensors arranged in proximity to the electrical load 14 and/or to auxiliary functions of the electrical load 14 and/or to control members, via the computer bus section 48.

The sensors arranged in proximity to the electrical load 14 are, for example, operating sensors of the electrical load 14, such as speed sensors when the electrical load is a motor, or temperature sensors. The auxiliary functions of the electrical load 14 are, for example, actuators acting on the electrical load, or even a heating circuit, making it possible to keep the electrical load above a minimum temperature. The control members are, for example, emergency stop devices for the electrical load 14.

Furthermore, the connection of the sensors and/or of the auxiliary functions of the electrical load 14 to the input-output connectors 56 is done in the cabling column 20 adjacent to the input-output unit 50, because this unit extends out of the functional module 40, as can be seen in FIGS. 3 and 4.

Each input-output unit 50 is associated with a monitoring-control plug-in unit 42. Thus, a functional module 40 comprises as many input-output units 50 as there are plug-in units 42.

The connection between an input-output unit 50 and a monitoring-control plug-in unit 42 is made using movable contacts, that are not represented. These movable contacts are configured to establish this connection as soon as the plug-in unit is displaced into the plugged-in position, such that no specific connection operation is necessary to establish this connection.

The computer bus section 48 is advantageous because it makes it possible to centralise all the connections and all the exchanges of data between the industrial computer 26, the monitoring-control plug-in units 42 and the electrical loads 14 in an electronic circuit board, which facilitates the implementation of these connections and reduces the quantity of cables that have to be installed in the electrical enclosure 10.

Furthermore, each monitoring-control plug-in unit of a functional module 40 also communicates information with the protection unit 44 of the functional module, via a movable contact that is not visible.

As can be seen in FIGS. 2 to 4, each functional module 40 comprises a support box 60, which supports all the functional elements 17 of this functional module 40.

The support box 60 of a functional module 40 comprises a framework 62 of parallelepipedal form, which defines an internal volume V62. The framework 62 is mounted in the frame 28 of the connection column 16, as can be seen in FIG. 2.

The framework 62 comprises:
two plates 64, that are horizontal in the mounted configuration of the box in the frame, comprising a top plate distinguished from a bottom plate. In the mounted configuration of the box in the frame, the plates 64 are parallel to the axes X and Y;
a back 66, that is perpendicular to the horizontal plates 64 and vertical in the mounted configuration of the box in the frame. In the mounted configuration of the box in the frame, the back is parallel to the axes X and Z; and
two walls 68A and 68B, that are perpendicular to the plates 64 and to the back 66 and that are vertical in the mounted configuration of the box in the frame, with a left wall 68A distinguished from a right wall 68B. In the mounted configuration of the box in the frame, the walls 68A and 68B are parallel to the axes Y and Z.

Preferably, the plates 64, the back 66 and the walls 68A and 68B are made of metal, for example of steel that has undergone a surface treatment, such as a zinc-coated steel, called "electrogalvanized" steel, or of galvanized steel.

The support box 60 further comprises at least one pair of rails 70 for guiding a monitoring-control plug-in unit 42 in translation, preferably six pairs of guiding rails 70.

In practice, each pair of guiding rails 70 comprises two rails 72 which are configured to allow the insertion of a monitoring-control plug-in unit 42 into the electrical enclosure 10, such that the plug-in unit is moveable in translation between its unplugged and its plugged-in position, parallel to the axis Y. Each pair of rails 70 is arranged such that a monitoring-control plug-in unit 42 inserted into this pair of rails is horizontal.

The plug-in unit 42 comprises, for example, wheels, not represented, allowing it to roll on the rails 72 of a pair of rails 70.

Furthermore, each vertical wall 68A and 68B supports one of the two rails 72 of each pair of rails 70.

The rails 72 extend according to the axis Y depthwise in the electrical enclosure 10 and are horizontal. Thus, the monitoring-control plug-in units 42 are also horizontal when they are inserted into the electrical enclosure 10.

A first embodiment of the box 60 is represented in FIGS. 2 to 9.

In this first embodiment, the protection unit 44 is fixed to the left wall 68A, inside the volume V62. Thus, the rails 72 situated on the left of the box 60 are fastened to the protection unit 44. In this configuration, the rails 72 situated on the left of the box 60 are nevertheless supported by the vertical wall 68A, since the protection unit 44 is itself fastened to this vertical wall.

As can be seen better in FIGS. 5 and 6, each plate 64 of the framework 62 comprises a main web 74, that is horizontal, and a border 76, perpendicular to the main web and parallel to the back 66 of the framework.

In each border 76 there are positioning holes 77 and fastening holes 78, the axes of which are parallel to the axis Y.

Furthermore, the main web 74 of each plate 64 comprises several members for fastening the framework 62 to the frame 28 of the electrical enclosure 10, which are fastening lugs 80 in the example.

The fastening lugs 80 of a horizontal plate 64 are integral, that is of a piece, with this plate. They are perpendicular to the main web 74 and to the border 76, so as to be parallel to the vertical walls 68A and 68B in the mounted configuration of the box 60, and extend from the main web 74 of a horizontal plate towards the other horizontal plate of the framework 62.

In the example represented, each horizontal plate 64 comprises four fastening lugs 80, each fastening lug being configured to be fastened to a vertical post 32 of the frame 28.

Furthermore, each fastening lug 80 comprises a positioning hole 81 and a fastening hole 82, the axes of which are parallel to the axis X.

Thus, each horizontal plate 64 is, in the mounted configuration of the box in the frame, fastened to four vertical posts 32.

Furthermore, the fastening lugs 80 are elastically deformable, so as to accommodate variations of dimensions in the separation of the vertical posts 32, as detailed hereinbelow.

Each horizontal plate 64 further comprises tabs 84, arranged on the main web 74.

The tabs 84 form protrusions, which extend from the main web 74 in the volume V62 of the box 62.

In the example represented, the tabs 84 are integral with the main web 74 and are formed by cutting then localized stamping of the main web.

On each main web, the tabs 84 are divided up into two groups, which each form a positioning guide 86. In practice, each positioning guide 86 comprises two adjacent rows of tabs 84, each row comprising at least two tabs 84 aligned on an axis parallel to the axis Y.

Each horizontal plate 64 also comprises positioning fingers 87, preferably two fingers 87. The positioning fingers 87 of a horizontal plate 64 extend perpendicularly to the main web 74 of that plate, so as to be parallel to the walls 68A and 68B in the mounted configuration of the box 60 and are directed, starting from the web of a horizontal plate 64, towards the other horizontal plate of the framework.

The back 66 of the framework 62 of the box 60 is fastened to the borders 76 of the two horizontal plates 64.

To allow this fastening, the back 66 comprises positioning holes 88 and fastening holes 89, respectively aligned with the positioning holes 77 and with the fastening holes 78 of the borders 76 of the horizontal plates.

The back 66 further comprises notches 90, four notches 90 in the example, that make it possible to position the vertical walls 68A and 68B.

The back 66 further comprises fastening holes 118, four fastening holes 118 in the example, that make it possible to fasten the vertical walls 68A and 68B.

The back 66 further comprises openings 91. When a monitoring-control plug-in unit 42 is mounted in the support box 60, the rear of the plug-in unit is situated facing an opening 91, which makes it possible to extract air from the plug-in unit 42 through the opening 91, so as to ensure a cooling of the plug-in unit.

In practice, the upstream fixed connectors 52 and the downstream fixed connectors 54 of a functional module 40 are arranged on either side of the openings 91, on the transverse axis Y.

The walls 68A and 68B of the framework 62 of the box 60 each comprise a main panel 92, a rear flange 94 and a front flange 96.

Each wall 68A and 68B further comprises protuberances 97, preferably two protuberances 97. Each protuberance 97 extends from the main panel 92 towards the rear of the box 60, in the extension of the main panel.

The rear flange 94 of each wall 68A and 68B is perpendicular to the main panel 92, that is to say that the rear flange is parallel to the back 66 of the box.

The front flange 96 of each wall 68A and 68B is parallel to the main panel 92, but offset, on an axis parallel to the axis X, from the main panel. A band 95, parallel to the rear flange 94, links the main panel 92 and the front flange 96. A strip 99 prolongs the front flange 96, opposite the band 95, this strip being parallel to the band 95.

On the rear flange 94 of each wall 68A and 68B there is at least one fastening hole 98, de preferably two fastening holes 98.

On the front flange 96 of each wall 68A and 68B there is at least one positioning hole 100, preferably two positioning holes 100.

Furthermore, the front flange 96 of each wall 68A and 68B also comprises at least one load absorbing lug 102, preferably two load absorbing lugs 102. The load absorbing lugs 102 also constitute members for fastening the framework 62 to the frame 28 of the electrical enclosure 10. Each load absorbing lug 102 is delimited by a U-shaped notch 103 cut out in the flange 96. Each lug 102 exhibits flexibility perpendicularly to the plane of the flange 96.

On each load absorbing lug 102 there is a fastening hole 104.

In a variant of the invention that is not represented, the walls 68A and 68B do not comprise a front flange 96 and the positioning hole or holes 100 as well as the load absorbing lugs 102 are formed on the main panel 92.

In a variant of the invention that is not represented, the walls 68A and 68B do not comprise a load absorbing lug 102.

The wall 68B further comprises positioning fingers 105, preferably four positioning fingers 105, respectively formed on the top and bottom edges of the main web 74.

Each wall 68A and 68B is fastened on the one hand to the back 66 of the box 60 and on the other hand to the frame 28 of the electrical enclosure 10.

Furthermore, each wall 68A and 68B is held by the horizontal plates 64, by being situated in a positioning guide 86 of each horizontal plate.

Thus, each positioning guide 86 is configured to position a wall 68A or 68B with respect to the horizontal plate 64 comprising this positioning guide.

Figure 7:
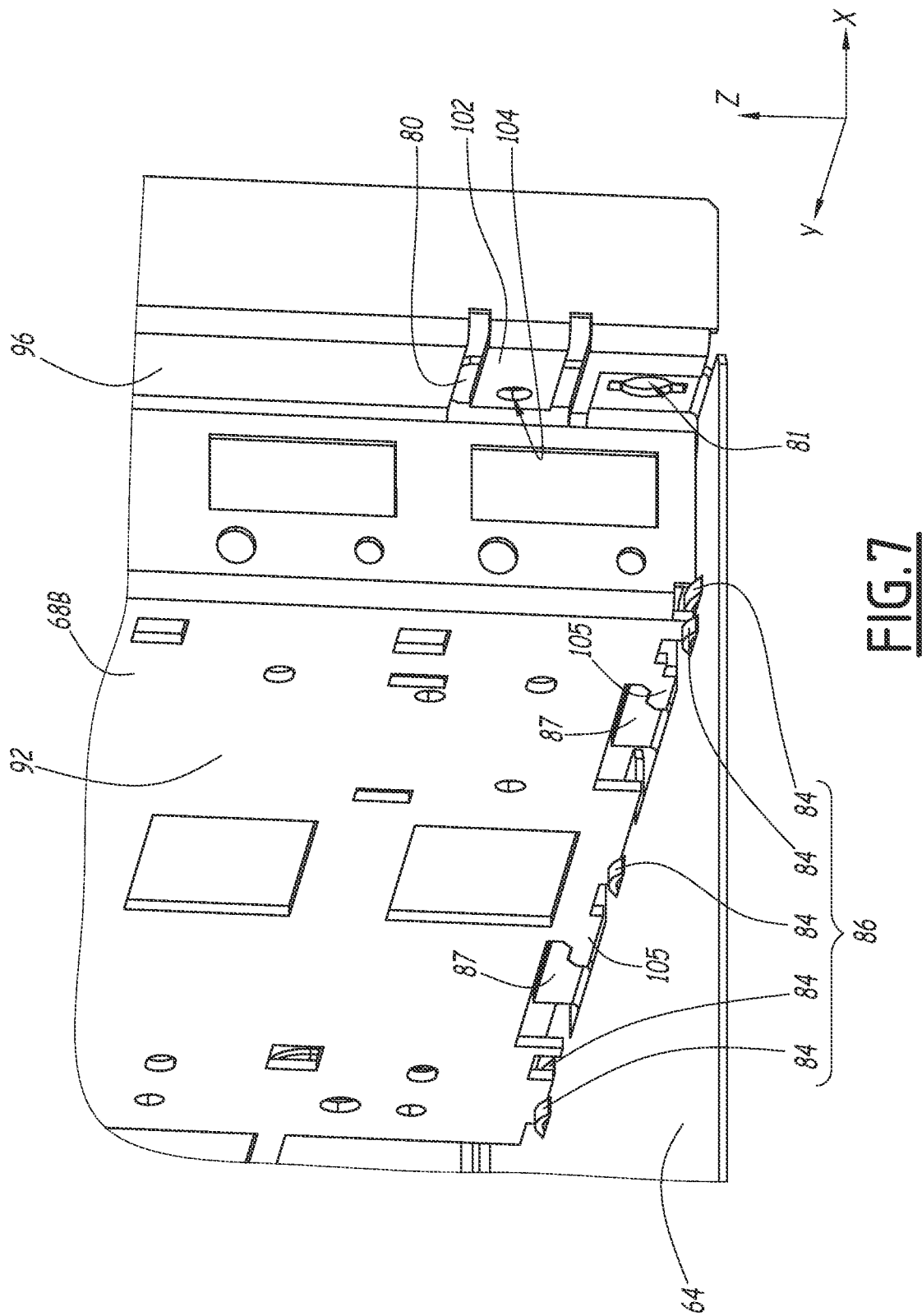
FIG. 7 is a larger scale view of the detail VII in FIG. 4.
Figure 8:
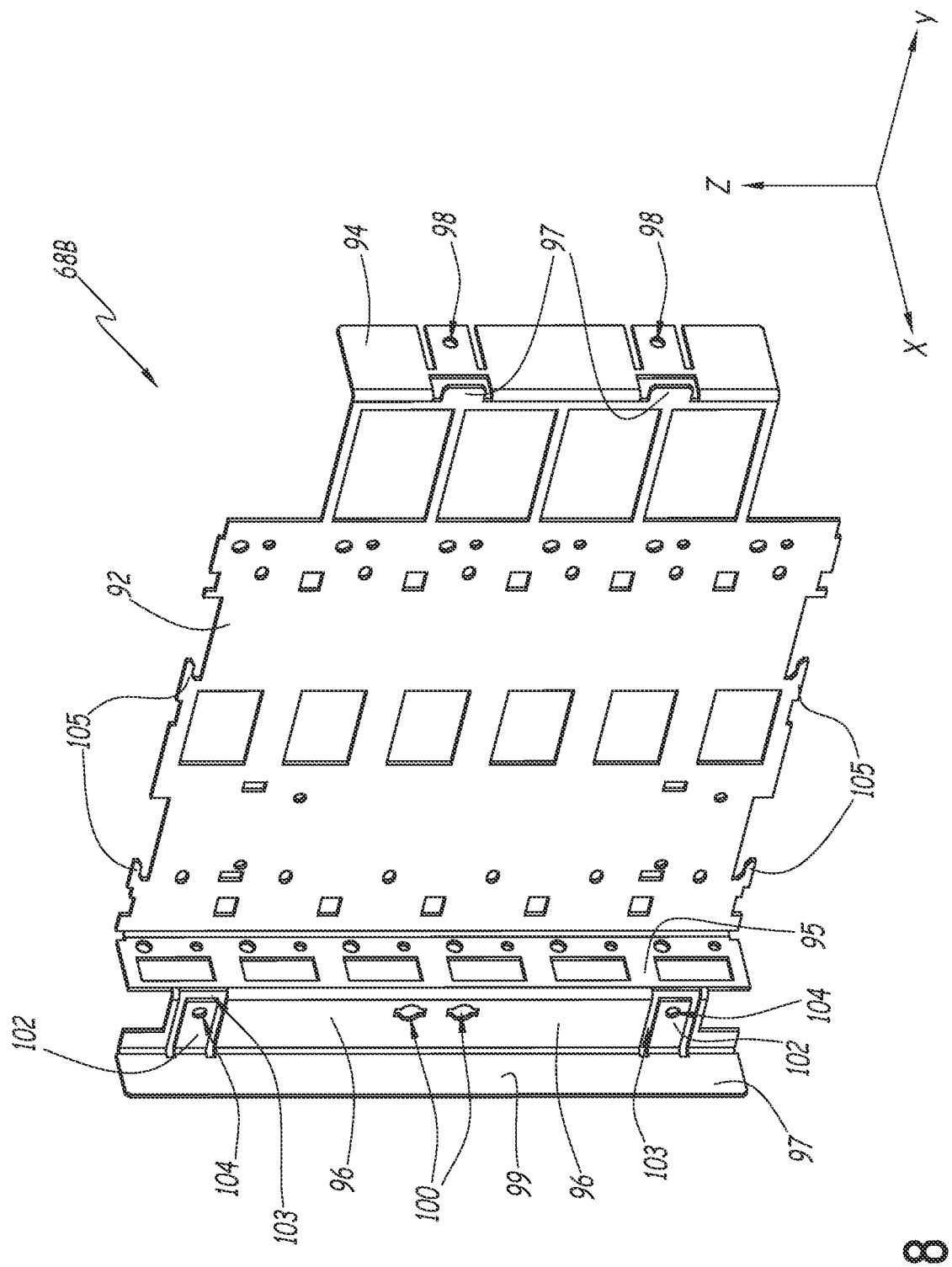
FIG. 8 is a perspective view of a vertical wall of the support box of FIGS. 2 to 7.
Figure 9:
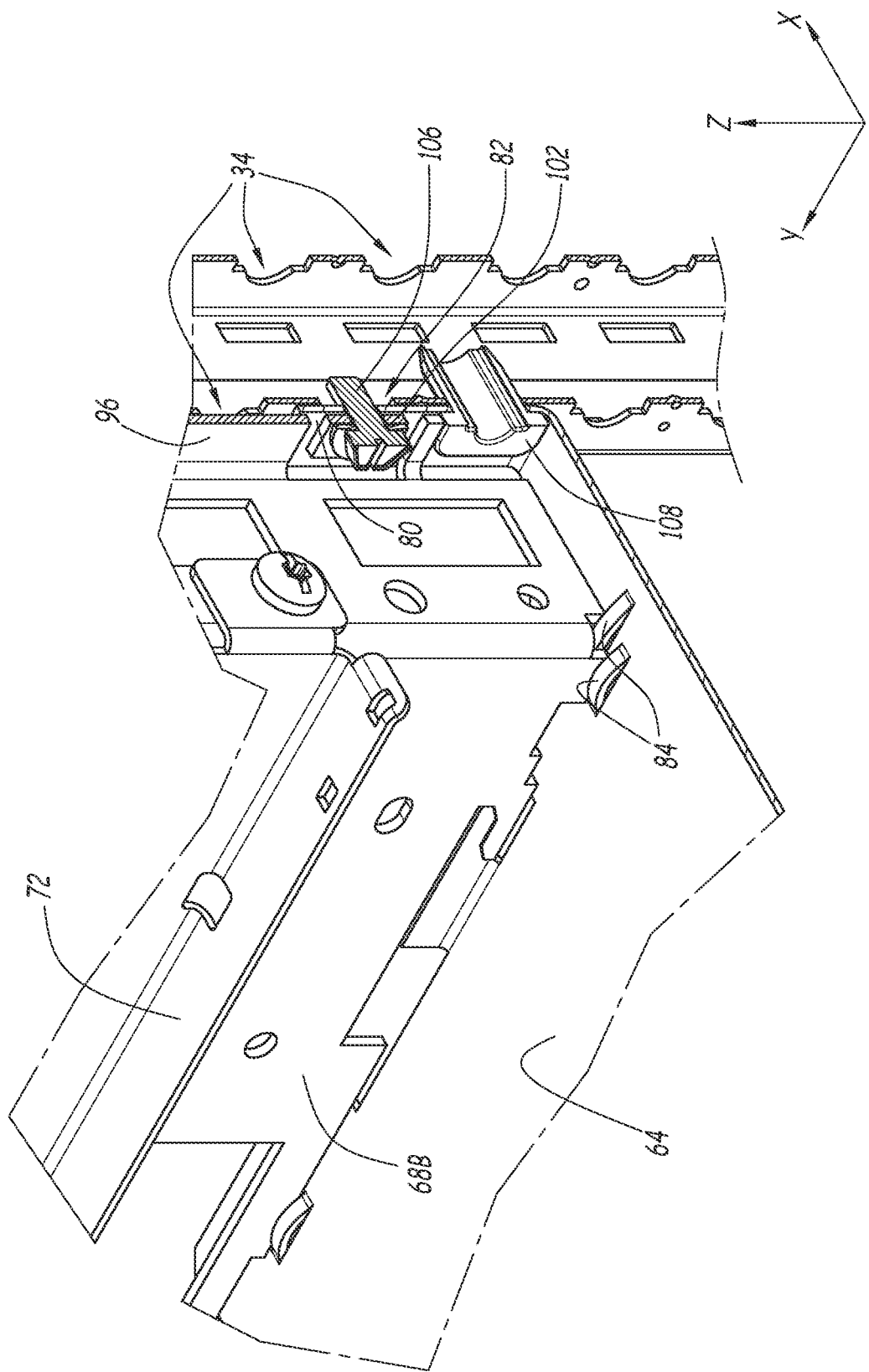
FIG. 9 is a longitudinal and perspective cross-section of a part of the electrical enclosure according to the plane IX in FIG. 2.

As can be seen better in FIG. 7, in which the rails 72 are omitted, the wall 68B represented in this figure is surrounded on both sides by the tabs 84, such that any translational movement of this wall on the axis X is prevented.

As emerges from FIGS. 3 and 4, the wall 68A, to which the protection unit 44 is fastened, is held differently by the positioning guides 86. In fact, for each plate 64, a first row of tabs 84 is arranged on the left of the wall 68A and a second row of tabs 84 is arranged on the right of the protection unit 44, so as to surround both the wall 68A and the protection unit 44.

In other words, the two rows of tabs 84 holding the vertical wall 68A are separated, on the axis X, by a distance substantially equal to the sum of the thickness of the wall 68A and of the thickness of the protection unit 44 and the two rows of tabs 84 holding the vertical wall 68B are separated, on the axis X, by a distance substantially equal to the thickness of the wall 68B.

In a variant of the invention that is not represented, the protection unit 44 comprises two grooves, arranged on a top face and on a bottom face of the protection unit and which extend on an axis parallel to the axis Y, configured to each receive a row of tabs 84 of a horizontal plate 64. In this variant, the wall 68A and the protection unit 44 are guided by the positioning guides 86 but the two rows of tabs 84 forming these positioning guides are separated, on the axis X, by a distance less than the sum of the thickness of the wall 68A and of the thickness of the protection unit 44.

The fastening of the back 66 to the horizontal plates 64 and of the walls 68A and 68B to the back 66 is performed using screws 106 and centring pins 108.

Figure 10:
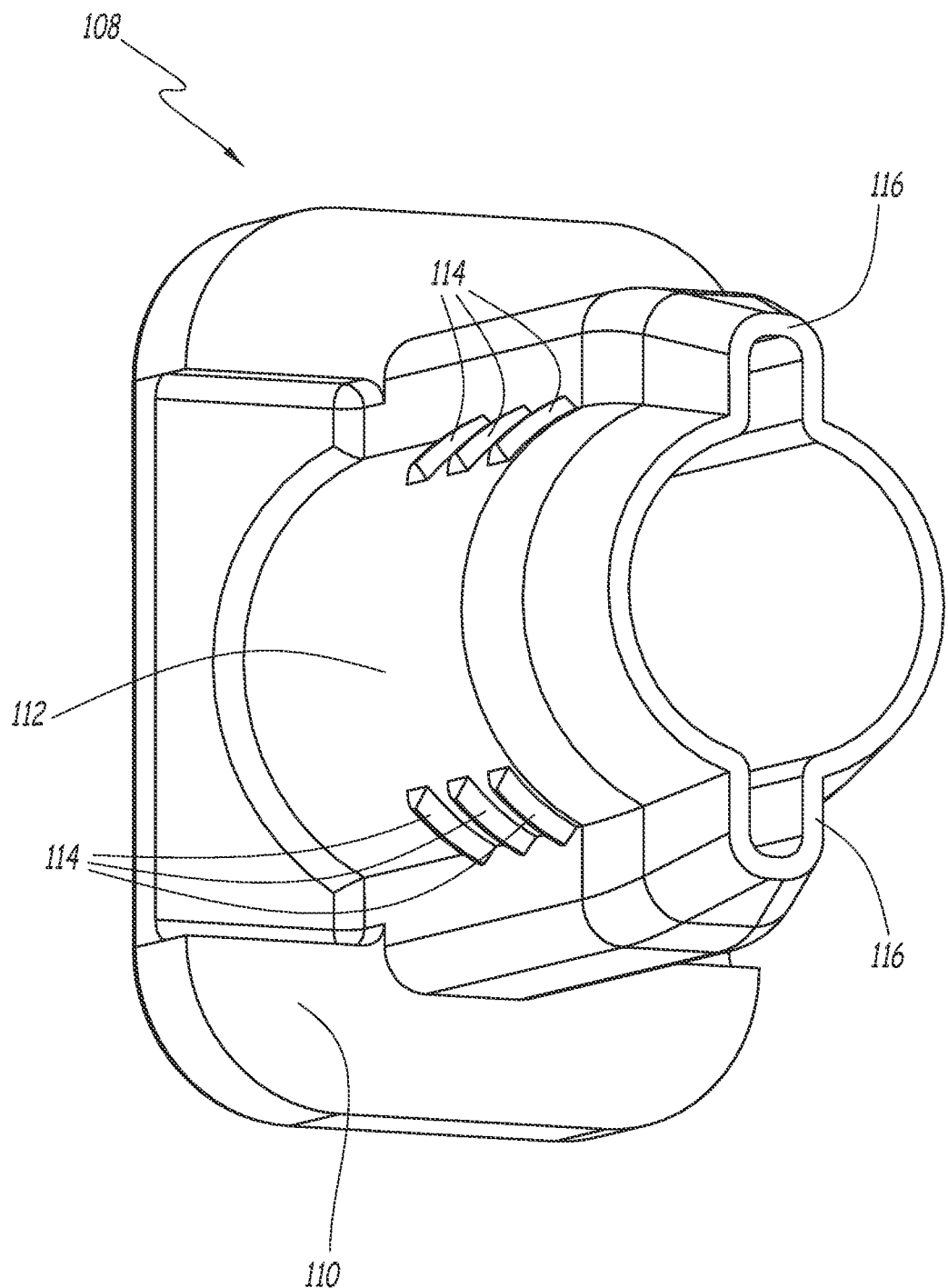
FIG. 10 is a perspective view of a centring pin used in the enclosure of FIGS. 1 and 2.

A centring pin 108 is illustrated on its own in FIG. 10.

The centring pin 108 comprises a head 110 and a body 112, on which several groups of catches 114 are formed. In practice, each centring pin 108 comprises at least two groups of catches 114. In the example represented, each pin comprises four groups of three catches. In FIG. 10, only two groups of catches 114 are visible. Within a group, the different catches 114 are positioned at different distances from the head 110 of the centring pin 108. The body 112 of each centring pin 108 also comprises two ridges 116 which give this body a non-circular section, matched to the form of the positioning holes and to the form of the fastening holes 34 of the vertical posts 32.

Preferably, the centring pins 108 are made of a composite material, more preferably of fibre-reinforced polyamide.

The box 60 is assembled directly in the electrical enclosure 10, on the frame 28.

To assemble the box 60 in the electrical enclosure, the horizontal plates 64 are first of all positioned with respect to the vertical posts 32 of the frame 28, then fastened to the vertical posts, during a first assembly step. For that, the positioning holes 81 of the fastening lugs 80 of the horizontal plates 64 are aligned with the fastening holes 34 of the vertical posts, then centring pins 108 are arranged in the positioning holes 81, so as to extend into the fastening holes 34 of the vertical posts 32 and align, or centre, the horizontal plates 64 with respect to the vertical posts. When a centring pin 108 is in place on a vertical post 32, two catches 114 of the pin are in contact with the post, so as to hold the horizontal plates 64 with respect to that post.

In practice, the centring pins 108 make it possible to vertically position the horizontal plates 64 with respect to the frame 28, without constraining the horizontal positioning of the plates. In fact, of the multiple pairs of catches 114 of a centring pin, only one pair of catches fastens the centring pin on a vertical post, according to the separation between the head 110 of the positioning pin and the post 32. Furthermore, the positioning of the horizontal plates 64 defines the positioning of the box 60, because the other elements of the framework 62 are positioned with respect to the horizontal plates. The centring pins 108 therefore make it possible to pre-position the box 60.

Thus, the pre-positioning of the support box 60 on the frame 28 by the centring pins 108 is ensured independently of the distance separating the box from a vertical post 32 at that pin, as long as that distance is less than the distance measured between the head 110 of the pin and the pair of catches 114 furthest away from the head 110.

In other words, the centring pins 108 make it possible to adapt to a play between the support box 60 and the vertical posts 32 of the frame 28.

Thus, the centring pins 108 make it possible, on the one hand, to facilitate the assembly of the support box 60 and, on the other hand, to facilitate the mounting of the support box 60 in the frame 28.

Next, the back 66 is assembled with the horizontal plates 64 during a second assembly step. For that, the back 66 is positioned with respect to the horizontal plates 64, by virtue of several centring pins 108, in the example, by virtue of four centring pins.

In practice, each centring pin 108 is pre-mounted in a positioning hole 88 of the back 66, so that the head 110 of the pin is in contact with the back 66 and the body 112 of the pin extends through the positioning hole 88.

Next, the back 66 is placed on the borders 76 of the horizontal plates 64, such that the body 112 of each centring pin 108 extends through a positioning hole 77 of a border 76. The catches 114 then retain the pins in the holes 77 and 88, and therefore the back 66 in position with respect to the borders 76.

Next, screws 106 are inserted into the fastening holes 89 of the back 66 and into the fastening holes 78 of the borders 76, so as to fasten the back 66 to the borders 76.

In a third assembly step, the vertical walls 68A and 68B are positioned. For that, each vertical wall 68A and 68B is slid, in a translational movement on an axis parallel to the axis Y, between the horizontal plates 64, until its rear flange 94 enters into contact with the back 66 and until the protuberances 97 of the main panel 92 penetrate into the notches 90 of the back 66. During this movement, each vertical wall 68A and 68B is guided by two positioning guides 86, namely one positioning guide formed on each horizontal plate 64. Furthermore, the positioning fingers 87 of the horizontal plates 64 and the positioning fingers 105 of the vertical walls are of complementary forms and in contact when the vertical walls are positioned with respect to the plates 64 and the back 66, so as to assist in the correct positioning of the vertical walls.

In practice, the protection unit 44 is mounted on the vertical wall 68A prior to the third step. Thus, it is the assembly of the vertical wall 68A and of the protection unit 44 which is guided between the positioning guides 86 situated on the left of FIGS. 3, 4 and 6.

After the rear flange 94 of a vertical wall 68A or 68B has made contact with the back 66 and the protuberances 97 have been inserted into the notches 90, the vertical wall and the back are fastened using screws 106, inserted through the fastening holes 98 of the rear flange 94 and the fastening holes 118 of the back 66.

In the assembled configuration of the framework 62, the fastening holes 104 of the load absorbing lugs 102 of the vertical walls 68A and 68B are aligned with the fastening holes 82 of the fastening lugs 80 of the horizontal plates 64.

Centring pins 108 are then arranged in the positioning holes 100, so as to extend into the fastening holes 34 of the vertical posts 32 and contribute to the alignment of the box 60 with respect to the vertical posts.

At the end of the third assembly step, the framework 62 is assembled and the box 60 is positioned with respect to the frame 28.

When the assembly of the framework 62 is finished, the box 60 is rigid, that is to say that it cannot be deformed when normal usage forces are applied to it. In fact, any force exerted on a first element out of the assembly composed of the two plates 64, of the back 66 and of the two walls 68A and 68B is transmitted to the other elements of this assembly so as to prevent the deformation of the first element.

This rigidity stems notably from the fact that the assembly of the framework 62 prevents any relative movement between the plates 64, the back 66 and the walls 68A and 68B.

For example, the presence of the back 66 prevents the structure formed by the horizontal plates 64 and the vertical walls 68 from being deformed into a non-rectangular parallelogram, that is to say such that the vertical walls 68 are no longer perpendicular to the horizontal plates 64.

It is advantageous for the box 60 to be rigid, because this rigidity guarantees a reliable and precise positioning of the functional elements 17, as well as the rails 72. This reliable and precise positioning is useful, for example to allow the monitoring-control plug-in units to roll normally in the rails 72 and to allow the plugging in of the plug-in units on the upstream 52 and downstream 54 fixed connectors.

This precision is all the more advantageous as the plugging in of a monitoring-control plug-in unit on fixed connectors 52 and 54 is complicated when the upstream connectors 52 are remote from the downstream connectors 54, as in the example represented where the upstream and downstream connectors are on either side of the openings 91 of the back 66.

The rigidity of the box 60 is all the more advantageous as the frame 28 of the electrical enclosure 10 can have defects, such that the posts 32 are not perfectly vertical. This rigidity makes it possible to compensate for these defects.

For example, it is commonplace for the posts of an electrical enclosure frame to be deformed inward from a connection column 16, which causes forces to be exerted on the box 60 when it is installed on the frame, because the width between two vertical posts can then be less than the width of the box 60. By virtue of the rigidity of the box 60, in such a situation, the vertical posts of the frame are straightened so as to be substantially vertical and the box is not deformed.

Furthermore, the fastening of the horizontal plates 64, of the back 66 and of the vertical walls 68A and 68B is done only using screws 106 and does not require recourse to complex fastening operations, such as welding for example. The framework 62 of the box 60 is therefore simple to assemble.

Next, in a fourth assembly step, the front of the box 60 is fastened to the vertical posts using screws 106, which are mounted through the fastening holes 104 of the load absorbing lugs 102 of the vertical walls 68A and 68B, through the fastening holes 82 of the fastening lugs 80 of the horizontal plates 64 and through the fastening holes 34 of the vertical posts 32.

At the same time, during the fourth assembly step, the rear of the box 60 is fastened to the vertical posts using screws 106, which are mounted through the fastening holes 82 of the fastening lugs 80 of the horizontal plates 64 and through the fastening holes 34 of the vertical posts 32. This fastening step can be seen better in FIG. 9. Thus, the box 60 is fastened to the frame 28 using screws 106, via the fastening lugs 80 and the load absorbing lugs 102.

In the example represented, identical screws 106 are used to assemble the framework 62, to fasten the rails 72 to the vertical walls 68A and 68B and to fasten the box 60 to the vertical posts 32.

In a variant of the invention that is not represented, several different types of screws are used to assemble the framework, to fasten the rails to the vertical walls and to fasten the box to the vertical posts.

This fastening method is particularly advantageous, because the fastening lugs 80 and the load absorbing lugs 102 are elastically deformable, which makes it possible to compensate for any deformation of the frame 28.

In fact, when, for example, the posts 32 of the frame 28 are deformed outward from the connection column 16, the width between two vertical posts increases so as to be greater than the width of the box 60. In such an example, the fastening lugs 80 and the load absorbing lugs 102 will be deformed when the screws 106 are tightened, to be pressed against the posts 32 of the frame, without this deformation affecting the other elements of the framework 62 of the box 60, which is rigid.

In other words, when the support box 60 is fastened to a deformed frame 28, the framework 62 of the box is not deformed and the fastening lugs 80 and 102 are deformed so as to compensate for the deformations of the frame 28. Thus, the box 60 is suspended on the frame 28 by the fastening lugs 80 and 102.

To sum up, by virtue of the fastening lugs 80 and the load absorbing lugs 102 on the one hand, and by virtue of the rigidity of the box 60 on the other hand, the box 60 can be installed in a frame 28 whose posts 32 are deformed inward or outward, without the box 60 being deformed.

By virtue of the support box 60, the mounting of a functional module 40 on the frame 28 is therefore performed by adapting to any defects of the frame 28.

Furthermore, the weight of a functional module 40 is transmitted to the frame 28 of the electrical enclosure 10, on the front of the box, via the fastening lugs 80, four lugs in the example, the load absorbing lugs 102, four lugs in the example, and the centring pins 108, two pins in the example, arranged in the positioning holes 100 of the front flange 96 of the vertical walls 68A and 68B and on the rear of the box via the fastening lugs 80, four lugs in the example.

In a fifth assembly step, the rails 72 are fastened to the vertical walls 68A and 68B using screws 106. Preferably, each rail 72 is fastened to a vertical wall using two screws 106.

In a variant, the fifth assembly step is performed between the third and fourth assembly steps, that is to say before the box is fastened to the vertical posts.

In a variant, the rails 72 are fastened to the vertical walls 68A and 68B before the third assembly step, that is to say before the vertical walls are mounted in the box.

The first to fifth steps mentioned above together constitute a first step, or in other words a phase or an operation, of the assembly method of the invention.

After installation of the support box 60 on the frame 28 of the electrical enclosure 10, the box 60 is equipped, during a second phase or operation of the assembly method, with the functional elements 17, such as the monitoring-control plug-in units 42, so as to form a functional module 40.

In practice, the monitoring-control plug-in units 42, the connection units 46 and the input-output units 50 are installed in the box 60 after the box is fastened to the frame 28.

In practice, the computer bus section 48 is installed in the box 60 without preference before or after the box is fastened to the frame of the electrical enclosure.

To sum up, the assembly of the electrical enclosure 10 comprises at least two distinct phases, consisting in:
assembling at least one support box 60 on the frame 28 of one or more connection columns 16, between the vertical posts 32; and
equipping each box 60 with functional elements 17 so as to form a functional module 40.

Note in FIG. 1 that, on the left hand connection column 16 of the electrical connection enclosure 10, the functional modules 40 have an orientation that is reversed with respect to the functional modules 40 of the right hand connection column 16 and with respect to the support box 60 represented in FIGS. 2 to 9.

In fact, the support box 60 has no preferred orientation, such that it can be turned right over before being installed in a connection column 16. When the support box 60 is turned over, the plates 64 remain horizontal, the vertical wall 68A is arranged on the right of the box 60 and the vertical plate 68B is arranged on the left of the box. This turning over affects neither the installation of the support box 60 in a connection column 16, nor the operation of the functional module 40 comprising this box.

Furthermore, the functional elements 17 have no preferred orientation and are configured to also be able to be turned over.

A second embodiment of the support box 60 will now be described, with reference to FIGS. 11 and 12.

In the second embodiment, the elements that are similar to those of the first embodiment bear the same references and operate in the same way. Hereinbelow, mainly the differences between the first and second embodiments are described.

Figure 11:
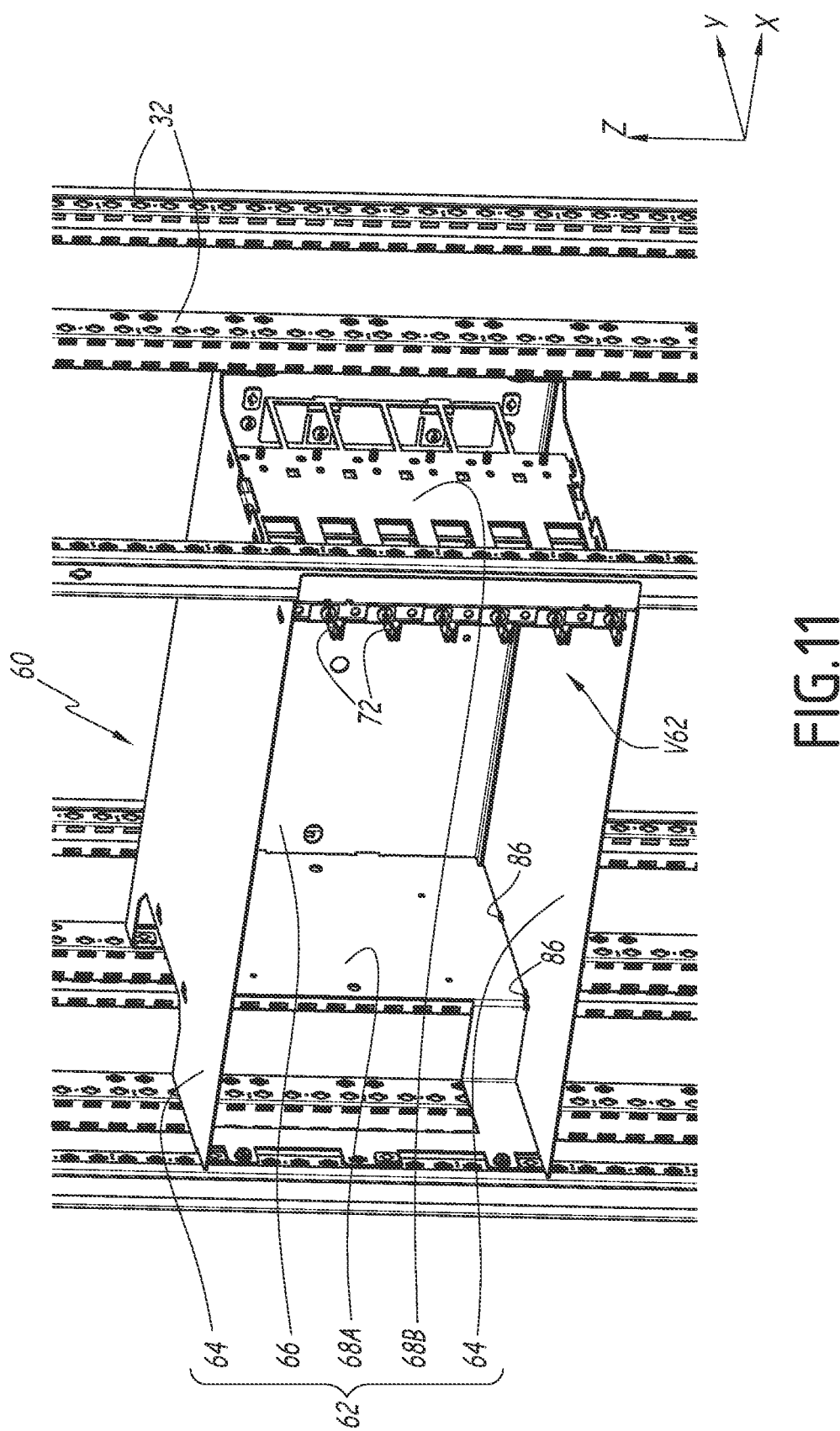
FIG. 11 is a perspective view of the frame of a second electrical enclosure that conforms to the invention, equipped with a second support box that conforms to the invention.
Figure 12:
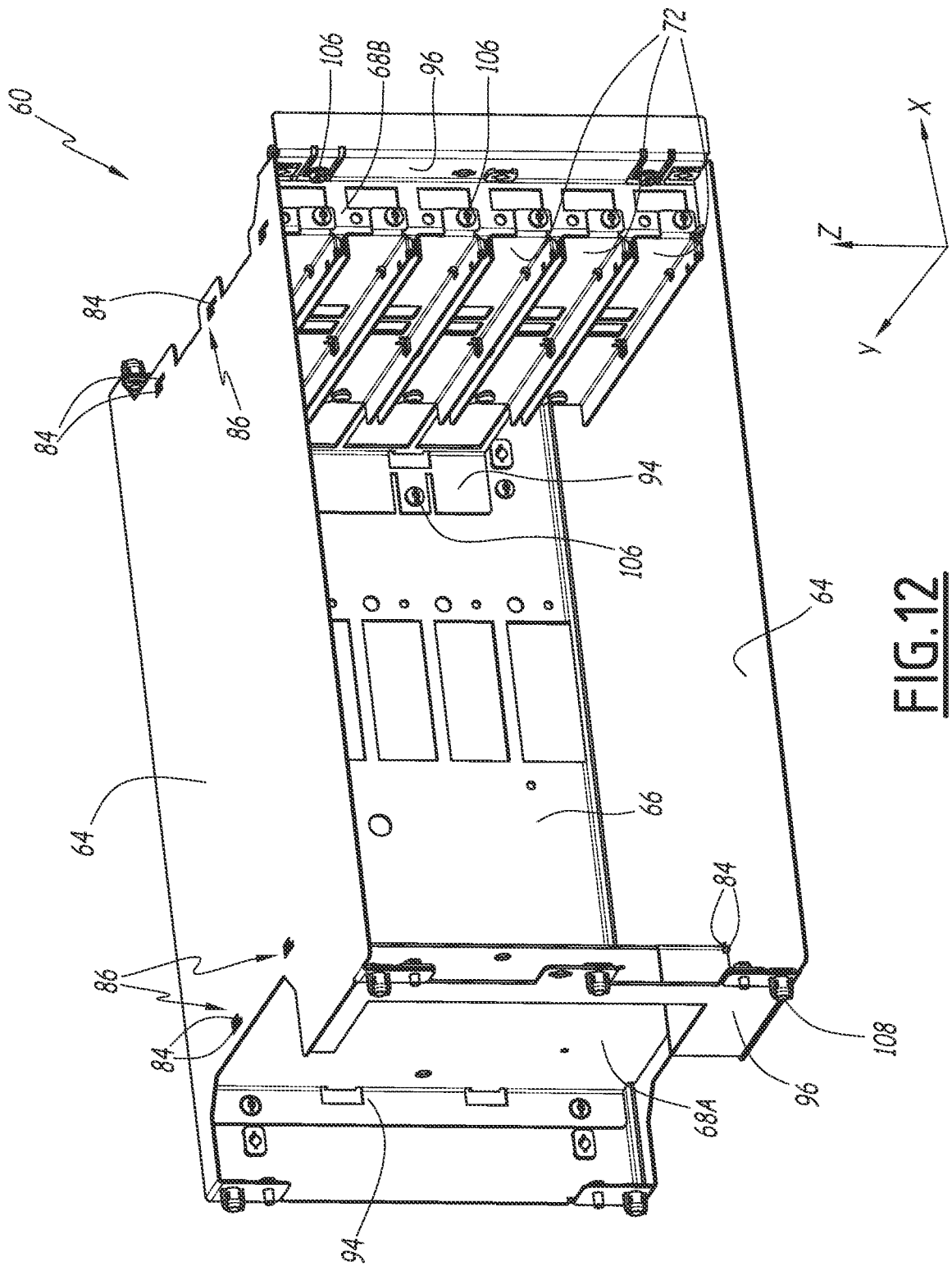
FIG. 12 is a perspective view of the support box of FIG. 11.

In this second embodiment, the protection unit 44, not represented in FIGS. 11 and 12, is installed in the box 60 after the assembly of the framework 62.

In these figures, the rails 72 supported by the vertical wall 68A are not represented, for greater legibility.

Furthermore, in this second embodiment, the wall 68A is held on its own between the positioning guides 86, without the protection unit 44 contributing to this hold.

Thus, during the assembly of the box 60, the vertical wall 68A is slid between the horizontal plates 64 by being guided by a positioning guide 86 of each horizontal plate 64.

For that, the tabs 84 surrounding the wall 68A form two rows which are as far apart from one another, on the axis X, as the rows of tabs of the positioning guide holding the wall 68B, that is to say separated by a distance substantially equal to the thickness of the vertical wall 68A.

In a variant that is not represented, the fastening lugs 80 of the rear of the box 60 are not integral with the horizontal plates 64 but are integral with the back 66 of the framework 62.

The embodiments and the variants envisaged above can be combined to generate new embodiments in the invention.

The invention claimed is:

1. A support box supporting functional elements within a frame of an electrical connection enclosure, the support box comprising:
at least one pair of rails, each pair of rails comprising two rails extending parallel to a common horizontal axis, each pair of rails being configured to allow the insertion of a monitoring-control plug-in unit into the support box, such that the monitoring-control plug-in unit is moveable in translation parallel to the horizontal axis between an unplugged position and a plugged-in position, the monitoring-control plug-in unit forming a functional element;
a parallelepipedal framework comprising:
two horizontal plates in a mounted configuration of the support box in the frame;
a back that is perpendicular to the horizontal plates and vertical in the mounted configuration of the support box in the frame; and
two walls that are vertical in the mounted configuration of the support box in the frame and that each support a rail of each of the pair of rails,
members for fastening the framework to the frame, wherein
the members for fastening the framework to the frame of the electrical connection enclosure comprise fastening lugs that are elastically deformable and integral with the horizontal plates,
the members for fastening the framework to the frame of the electrical connection enclosure comprise elastically deformable load absorbing lugs, that are integral with the vertical walls,
the support box further comprises at least one centring pin, configured to vertically centre the support box with respect to a post of the frame of the electrical connection enclosure, each centring pin being arranged in a positioning hole of one of the fastening lugs.

2. A support box according to claim 1, wherein each plate of the framework comprises a main web, horizontal in the mounted configuration of the support box in the frame of the electrical connection enclosure, and a border, perpendicular to the main web and parallel to the back of the framework, and wherein the back of the framework is fastened to the borders of the plates.

3. A support box according to claim 1, wherein each horizontal plate of the framework comprises tabs forming two positioning guides, each positioning guide being configured to position a vertical wall of the framework with respect to the horizontal plate comprising this positioning guide.

4. A support box according to claim 1, wherein the back of the framework comprises at least two notches, each notch being configured to position a vertical wall of the framework with respect to the back.

5. An electrical connection enclosure comprising:
a frame, the frame being of overall parallelepipedal form and comprising vertical posts;
at least one support box according to claim 1; and
at least one functional element, including at least one monitoring-control plug-in unit, each functional element being mounted in one of the at least one support box and each monitoring-control plug-in unit being movable in translation parallel to the horizontal axis in a pair of rails of the at least one support box between an unplugged position and a plugged-in position.

6. An electrical connection enclosure according to claim 5, wherein the functional elements mounted in one of the at least one support box comprise at least:
at least one of the at least one monitoring-control plug-in unit,
a protection unit, the protection unit being common to all of the at least one monitoring-control plug-in units mounted in the support box, supplying electrical power to all the monitoring-control plug-in units and electrically protecting all the monitoring-control plug-in units, the protection unit being fastened to a vertical wall of the framework of the support box and supporting the rail of each pair of rails associated with this vertical wall, a computer bus section configured to connect all the monitoring-control plug-in units of the support box to an industrial computer, and several connection modules, notably as many connection modules as there are monitoring-control plug-in units, each connection module being configured to electrically connect a monitoring-control plug-in unit to an electrical load.

7. A method for assembling an electrical connection enclosure, comprising at least:

assembling a support box according to claim 1 on the frame of the electrical connection enclosure, between vertical posts of the electrical connection enclosure; and equipping the support box, in place in the frame, with functional elements.

\* \* \* \* \*